(12) United States Patent
Chien

(10) Patent No.: US 6,498,724 B1
(45) Date of Patent: Dec. 24, 2002

(54) HEAT DISSIPATION DEVICE FOR A COMPUTER

(76) Inventor: Sen Long Chien, 1F, No. 33, Sung Shin Rd., Taipei (TW)

(*) Notice: Subject to any disclaimer, the term of this patent is extended or adjusted under 35 U.S.C. 154(b) by 0 days.

(21) Appl. No.: 09/915,281

(22) Filed: Jul. 27, 2001

(51) Int. Cl.[7] .................................................. H01K 7/20
(52) U.S. Cl. ...................... 361/687; 361/697; 361/704; 257/713; 454/184
(58) Field of Search .................. 361/683–697, 361/700–722, 818, 848, 849, 699; 165/80.3, 80.4, 185, 121–126; 454/184; 257/706–727; 174/16.3, 252; 415/177, 178, 213.1, 214.1; 312/236

(56) References Cited

U.S. PATENT DOCUMENTS 5,943,210 A * 8/1999 Lee et al. .................. 361/697
6,282,091 B1 * 8/2001 Horng ........................ 361/697

FOREIGN PATENT DOCUMENTS

DE        29914753 U1 *   1/1999  ............ H05K/7/20

* cited by examiner

*Primary Examiner*—Lynn D. Feild
*Assistant Examiner*—Michael Datskovsky
(74) *Attorney, Agent, or Firm*—Bacon & Thomas, PLLC

(57) ABSTRACT

The present invention relates to a heat dissipation device for a computer, more particularly relates to a heat dissipation device having a mounting structure for readily mounting a heat dissipation device onto a computer case or printed circuit board in order to draw out the heat generated by semiconductor devices of the computer, wherein the heat dissipation device may be mounted onto a plate of the computer case by fastening members and elastic members, in addition, the heat dissipation device may directly be mounted onto a printed circuit board and connected a heat sink and a semiconductor device to the printed circuit board for cooling the semiconductor device.

5 Claims, 3 Drawing Sheets

HEAT DISSIPATION DEVICE FOR A COMPUTER

The present invention relates to a heat dissipation device for a computer, more particularly relates to a heat dissipation device having a mounting structure for readily mounting a heat dissipation device onto computer case or printed circuit board in order to draw out the heat generated by semiconductor devices of the computer, wherein the heat dissipation device may be mounted onto a plate of the computer case by fastening members and elastic members, in addition, the heat dissipation device may directly be mounted onto a printed circuit board and connected a heat sink and a semiconductor device to the printed circuit board for cooling the semiconductor device.

PRIOR ART

It is commonly known in the art the method to mount a heat dissipation fan and heat sink onto the semiconductor device or the printed circuit board is secured a frame, which accommodates the heat sink and the semiconductor device, by screwing several screws into the printed circuit board. However, this mounting method should be screwing each screw one by one. This methods to mount heat dissipation devices to semiconductor devices shall connect the heat dissipation fan to the heat sink and connect the heat sink to the semiconductor device by using several fastening assembly, such as screws, thus, it is need more time and cost to mount the heat dissipation fan and heat sink onto the semiconductor devices.

Another method to mount a heat dissipation fan and heat sink onto the semiconductor device or the printed circuit board will be secured the heat sink onto a frame, which could be mounted on the base of semiconductor device, and then, mounted the heat dissipation fan onto the frame by locking wedges to orifices of the frame. It is will not be need screw the screws into the printed circuit board to mount the heat dissipation fan, however, the length of the wedge is fixed and the heat sink shall be matched the height, that is, the heat sink may not be connected firmly onto semiconductor device in case of the height of the heat sink is too low and the heat sink can not be connected onto semiconductor device in case of the height of the heat sink is too high.

SUMMARY OF THE PRESENT INVENTION

The present invention overcomes the above-mentioned disadvantages and drawbacks and provides a new mounting structure of fastening device for mounting the heat dissipation fan onto a plate of the computer case or mounting the heat dissipation fan onto a printed circuit board to connect a heat sink and a semiconductor device to the printed circuit board to cool the semiconductor device.

It is an object of the present invention to provide a heat dissipation device which comprising a fan and a mounting structure for mounting the heat dissipation fan onto a printed circuit board, wherein said a mounting structure comprising a support plate having an aperture to accommodate the fan and a pair of sleeve; and a fastening member comprising a head and a inserting end and an elastic member, and there are a pair of wedge protruded on the inserting end. As assembling, inserting the inserting end of the fastening member through holes of the printed circuit board, and wedges of the fastening member will be locked against the edge of holes of the printed circuit board. It is a simple, easy and economic method to assemble a heat dissipation device.

It is a further object of the present invention to provide a heat dissipation device which having a fastening member incorporated with an elastic member, as fastening the fastening member to the printed circuit board, the elastic member will adjust the height between support plate of the mounting structure and the printed circuit board so that the heat dissipation device can accept a heat sink with various height.

It is a further object of the present invention to provide a heat dissipation device which comprising a fan, a support plate and mounting structure for mounting the heat dissipation fan onto a plate of the case of a computer. Accordingly, this heat dissipation device will be mounted onto a plate with an opening has nearly same diameter as the aperture of support plate. The heat dissipation device may draw out the hot air inside of the computer case generated by all electronic devices.

Preferred embodiments of the present invention will be described as follows, referring to the drawing figures.

DESCRIPTION OF THE PRESENT INVENTION

Figure 1:
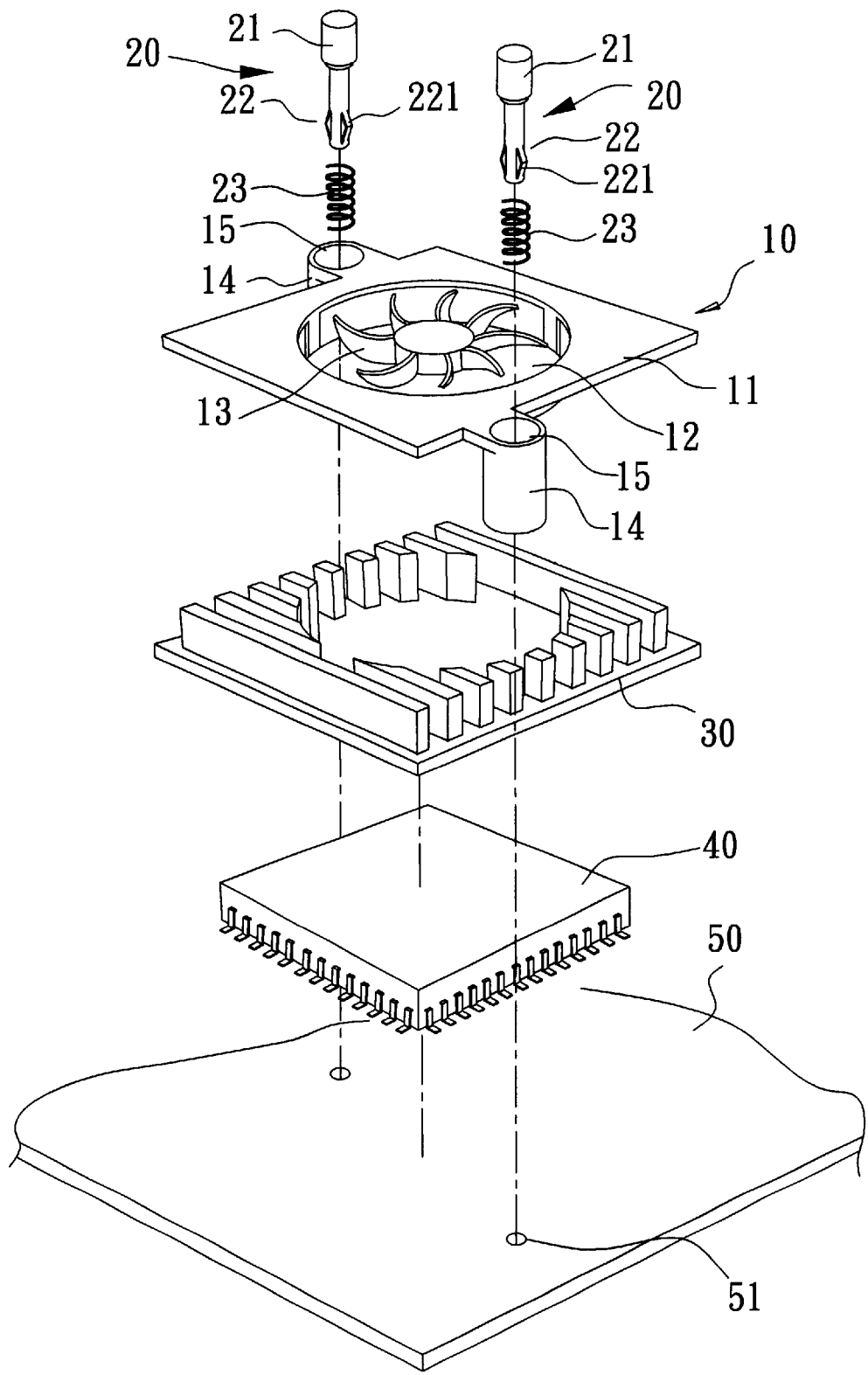
FIG. 1 shows an exploded view of mounting a heat dissipation device, a heat sink and a semiconductor device onto the printed circuit board.
Figure 2:
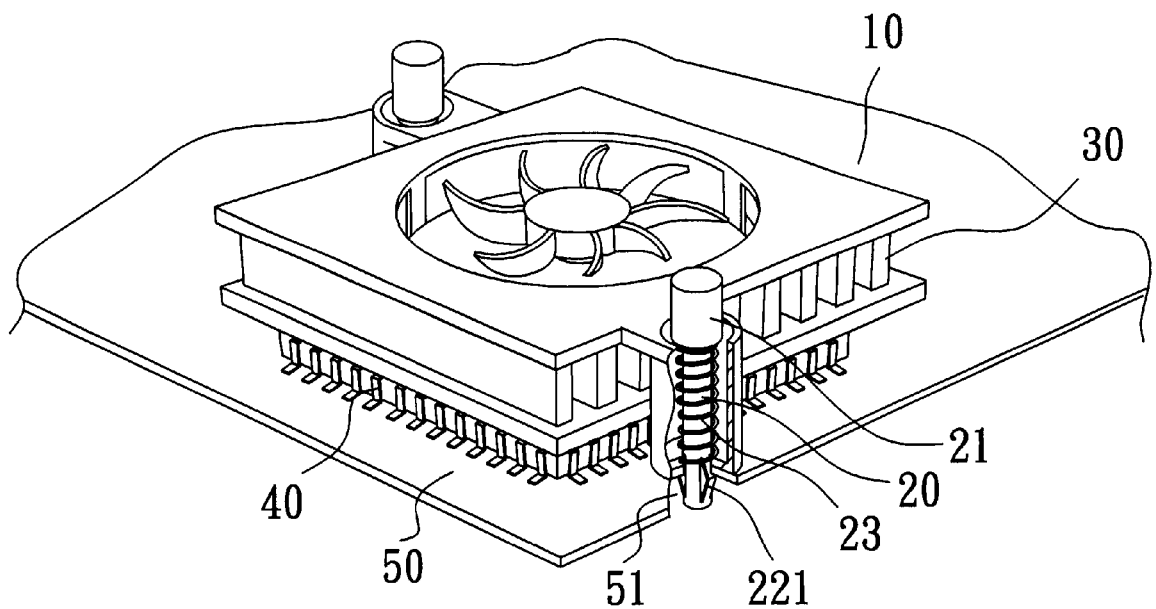
FIG. 2 shows a assembled view of FIG. 1.

Referring now to FIGS. 1 and 2, the present invention relates to a heat dissipation device 10 for readily mounting to a heat sink 30 and a semiconductor device 40 onto the printed circuit board 50, said heat dissipation device 10 having a fastening member 20, which comprising a head 21 and a inserting end 22, and there are a pair of resilient wedge 221 protruded outwardly on the inserting end 22. The fastening member is incorporated with an elastic member. Wherein said elastic member at the preferable embodiment is a spring 23. Meanwhile, the heat dissipation device 10 having a support plate 11 with an aperture 12, which accommodated the fan 13, and on the exterior of the support plate 11 in the opposite position having a pair of extensive downwardly sleeve 14 with a through hole 15. The spring 23 will be defined in the space within the head 21 and the sleeve 14. The fastening member 20 inserted through hole 15 and wedged against the hole 51 of the printed circuit board 50.

During using the heat dissipation device 10, with reference to FIG. 2, placing the heat sink 30 over the semiconductor device 40, which had secured on the printed circuit board 50, then placing the heat dissipation device 10 over the heat sink 30, and aligning the sleeve 14 to the hole 51 of the printed circuit board 50. Inserting, with slight force, the inserting end 22 of fastening member 20 through the hole 51 of printed circuit board 50, the resilient wedge 221 will pass the through hole 15 of the sleeve 14 and the hole 51 of printed circuit board 50. The resilient wedge 221 will be deformed inwardly by compressing force as it encountered the hole 51, while resilient wedge 221 extended as it passed the hole 51. Meanwhile, resilient wedge 221 will be lock on the edge of the hole 51 and, as a result, the heat dissipation device 10 could be fastened onto the printed circuit board 50. Furthermore, the height between support plate 11 of the mounting structure and the printed circuit board 50 will be adjusted due to the force of the spring 23, so that the heat dissipation device 10 can accept a heat sink 30 with various height and given a good thermal contact property between the heat sink 30 and the semiconductor device 40. Consequently, the present invention provides an efficient cooling performance to the heat dissipation device and a simple, easy and economic method to assemble this device.

Figure 3:
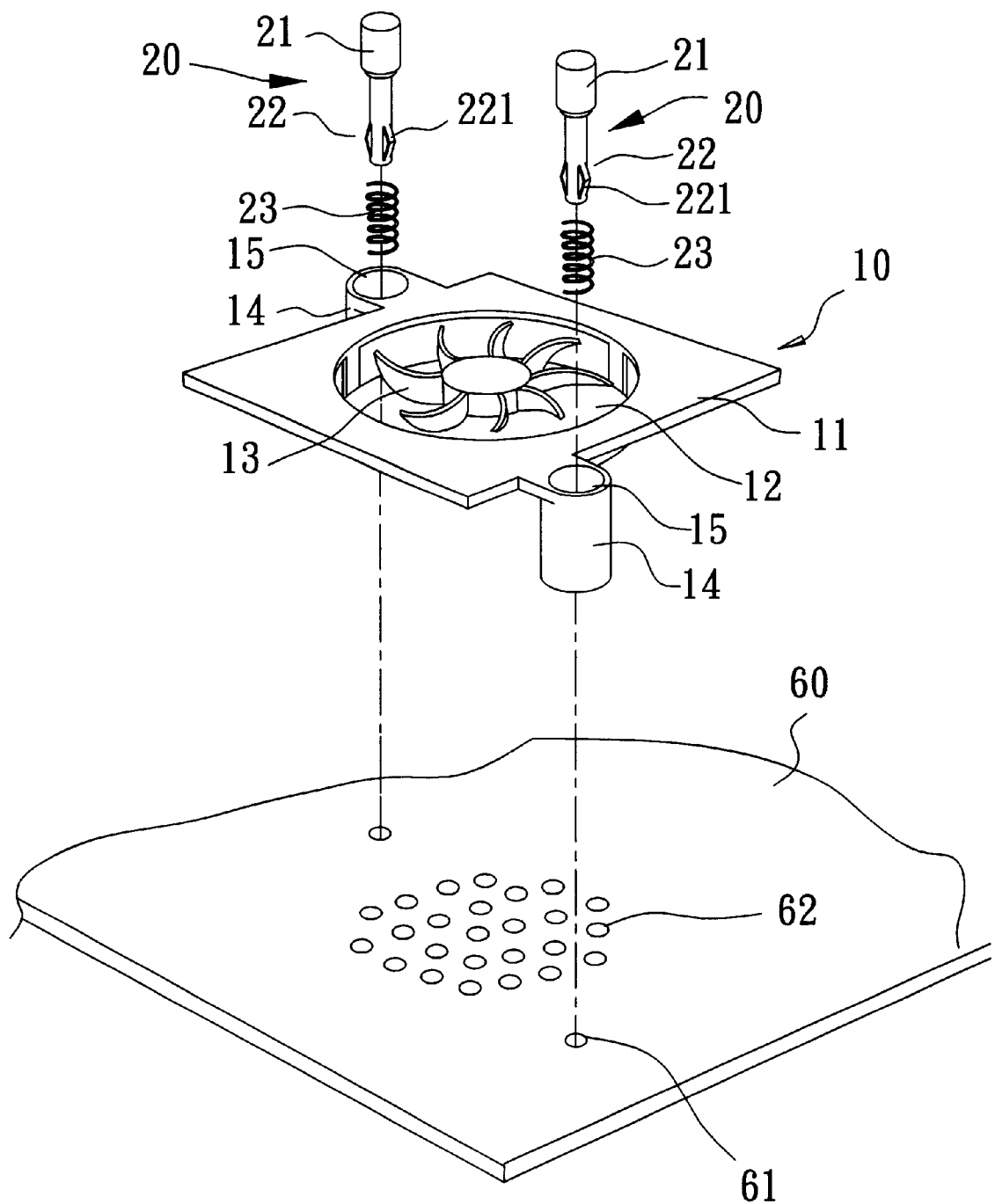
FIG. 3 shows an exploded view of mounting a heat dissipation device onto a plate of computer case.

Referring now to FIG. 3, Inserting, with slight force, the inserting end 22 of fastening member 20 through the hole 61 of the plate 60 of computer case, the resilient wedge 221 will pass the through hole 15 of the sleeve 14 and the hole 61 of the plate 60 of computer case. The resilient wedge 221 will be deformed inwardly by compressing force as it encountered the hole 61, while resilient wedge 221 extended as it passed the hole 61. Meanwhile, resilient wedge 221 will be lock on the edge of the hole 61 and, as a result, the heat dissipation device 10 could be fastened onto the plate 60 of computer case. The opening 62 of the plate 60 of the computer case has nearly same diameter as the aperture 12 of support plate 11. The heat dissipation device may draw out the hot air, via the opening 62, inside of the computer case generated by all electronic devices.

It is to be understood that the embodiments described above are merely illustrative of some of the many specific embodiments of the invention, and that other arrangements can be devised by one of ordinary skill in art at the time the invention was made without departing from the scope of the invention.

What the invention claimed is:

1. A heat dissipation device for a computer, comprising:
    a fastening member, comprising a head and an inserting end, and a pair of resilient wedges protruded outwardly on the inserting end;
    an elastic member; and
    a support plate with an aperture, wherein said aperture accommodated a fan;
    the elastic member is incorporated with the fastening member and located in a space between the head and a sleeve of the support plate.

2. A heat dissipation device according to claim 1, wherein on the exterior of said support plate in the opposite position having a pair of extensive downwardly sleeve with a through hole.

3. A heat dissipation device according to claim 1, wherein said elastic member is a spring.

4. A heat dissipation device according to claim 1, the heat dissipation device is placed on a heat sink over a semiconductor device and mounted onto the printed circuit board and is employed for cooling a heat sink over a semiconductor device.

5. A heat dissipation device according to claim 1, the heat dissipation device is mounted onto a plate of the computer case and is employed for drawing out hot air inside computer case.

* * * * *